United States Patent
Takahashi et al.

(10) Patent No.: US 7,277,344 B2
(45) Date of Patent: Oct. 2, 2007

(54) SEMICONDUCTOR STORAGE DEVICE AND OPERATING METHOD THEREFOR

(75) Inventors: Hiroyuki Takahashi, Kanagawa (JP); Takuya Hirota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 37 days.

(21) Appl. No.: 11/360,593

(22) Filed: Feb. 24, 2006

(65) Prior Publication Data

US 2006/0198226 A1 Sep. 7, 2006

(30) Foreign Application Priority Data

Mar. 4, 2005 (JP) ............................. 2005-060987

(51) Int. Cl.
*G11C 7/00* (2006.01)
(52) U.S. Cl. ..................... 365/222; 365/227; 365/229
(58) Field of Classification Search ................ 365/222, 365/229, 227, 230.06, 230.08
See application file for complete search history.

(56) References Cited

U.S. PATENT DOCUMENTS

| | | | |
|---|---|---|---|
| 6,879,536 B2 * | 4/2005 | Lee | 365/222 |
| 6,967,886 B2 * | 11/2005 | Huang et al. | 365/222 |
| 7,054,223 B2 * | 5/2006 | Takahashi et al. | 365/233 |
| 7,061,818 B2 * | 6/2006 | Sunaga et al. | 365/222 |
| 2002/0001247 A1 * | 1/2002 | Kim et al. | 365/222 |

FOREIGN PATENT DOCUMENTS

WO   WO 02/82454   3/2002

\* cited by examiner

*Primary Examiner*—Richard T. Elms
*Assistant Examiner*—Hien Nguyen
(74) *Attorney, Agent, or Firm*—Young & Thompson (57) ABSTRACT

A semiconductor storage device according to an embodiment of the present invention includes: a plurality of word lines; a plurality of memory cells corresponding to the plurality of word lines; and a refresh circuit for sequentially driving the plurality of word lines to refresh each of the plurality of memory cells based on a timer period, which sets the timer period in accordance with a disturb amount in an active mode upon shift from the active mode to the standby mode.

20 Claims, 12 Drawing Sheets

SEMICONDUCTOR STORAGE DEVICE AND OPERATING METHOD THEREFOR

BACKGROUND OF THE INVENTION

1. Field of the Invention

The present invention relates to a semiconductor storage device, and an operating method for the semiconductor storage device. In particular, the invention relates to a semiconductor storage device that executes a refreshing operation, and an operating method for the semiconductor storage device.

2. Description of Related Art

In semiconductor storage devices such as a DRAM and a pseudo SRAM, a capacitor of a memory cell accumulates charges to store data. An amount of the charges accumulated in the capacitor is reduced with time due to a leak current or the like. To prevent a data loss, the DRAM or the pseudo SRAM needs to periodically execute a refreshing operation for reading data and rewriting the data for each memory cell. As an example of a refresh mode, a "self-refresh mode" that an internal circuit automatically executes a refreshing operation in response to an internal clock has been known in the art.

Figure 1:
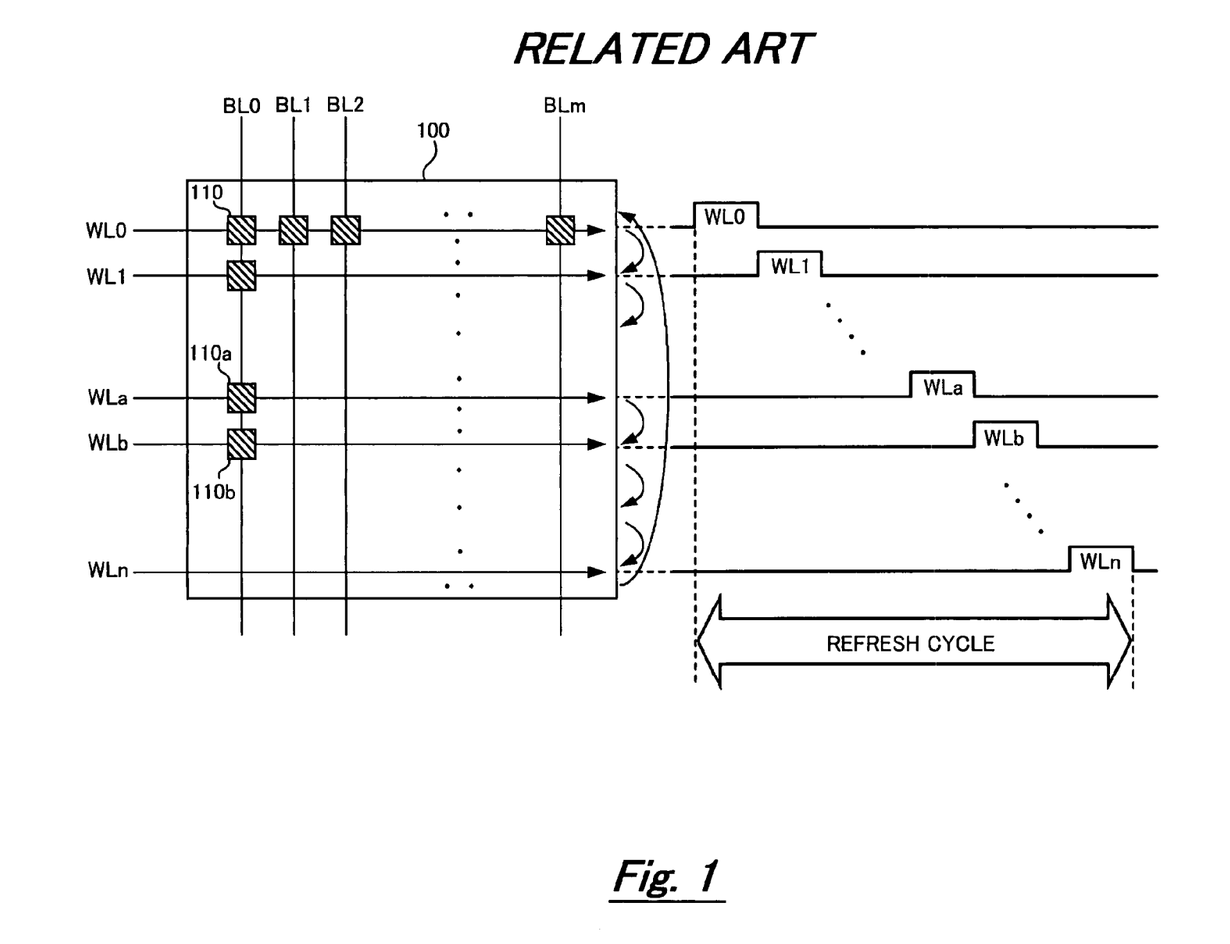
FIG. 1 illustrates a self-refresh operation of a conventional semiconductor storage device.

FIG. 1 illustrates a typical self-refresh operation. More specifically, FIG. 1 shows the general configuration of a memory cell array 100, and operational timings in a self-refresh operation. In FIG. 1, plural word lines WL0 to WLn cross plural bit lines BL0 to BLm, and memory cells 110 are arranged at each intersection therebetween. As shown in the timing chart of FIG. 1, the self-refresh operation is executed by driving the plural word lines WL0 to WLn sequentially and repeatedly. The word lines are driven based on a clock signal generated by a predetermined timer circuit, and a period necessary for driving all the plural word lines WL0 to WLn is called a "timer period". For example, a memory cell 110a connected with a word line WLa is refreshed at every timer period.

A longer timer period leads to reduction in power consumed by the self-refresh operation. However, the too long timer period increases a charge leak amount, resulting in a loss of stored data. Regarding the DRAM or pseudo SRAM, an estimated period for holding data is referred to as "hold characteristic". This hold characteristic varies depending on a state (active or standby state) of each memory cell array 100. For example, under the active state, the hold characteristic (Disturb Hold) is about 30 ms. Under the standby state, the hold characteristic (Static Hold) is about 150 ms. In an active mode, accesses to the memory cells 110 are made, so a leak current increases as compared to a standby mode. As a result, the hold characteristic of the active mode is deteriorated as compared with that of the standby mode. There has been known a technique of setting a timer period in the standby mode longer than that in the active mode for the purpose of saving power consumption by taking advantage of a difference in hold characteristic.

Figure 2:
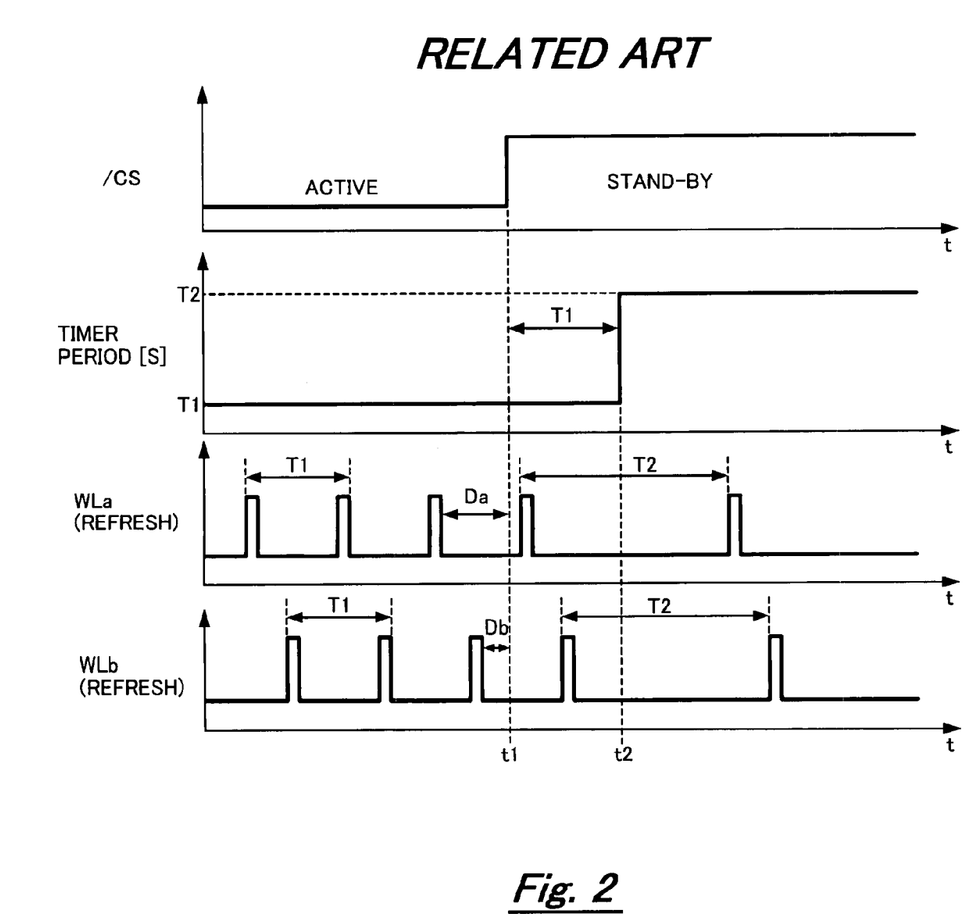
FIG. 2 is a timing chart showing a self-refresh operation of the conventional semiconductor storage device.

FIG. 2 is a timing chart of a self-refresh operation of a semiconductor storage device as disclosed in International Patent Application Publication No. WO 02/082454. FIG. 2 shows a chip select signal "/CS", timer period, a refresh pulse for the word line WLa (see FIG. 1), and a refresh pulse for another word line WLb. The chip select signal "/CS" is a signal for controlling an operational state of the semiconductor storage device. The semiconductor storage device enters in an active mode when the chip select signal "/CS" is at a Low level, while the device enters in a standby mode when the chip selection signal "/CS" is at a High level. In the illustrated example of FIG. 2, the chip select signal "/CS" is shifted from the Low level to the High level at a time t1, and the operational state is accordingly changed from the active mode to the standby mode. A given word line WL is refreshed during a timer period T1 in an active mode, and refreshed during a timer period T2 in a standby mode. The timer period T1 is determined based on the "Disturb Hold". On the other hand, the timer period T2 is determined based on the "Static Hold", and is set longer than the timer period T1.

As shown in FIG. 2, a period from the last refreshing time for the word line WLa in the active mode to the time t1 is represented as Da. Further, a period from the last refreshing time for the word line WLb in the active mode to the time t1 is represented as Db. The period Da is set longer than the period Db, and more approximate to the timer period T1. Assuming here that at the time t1, the timer period is set to T2 instantly, the memory cell 110a that is expected to be refreshed just after the time t1 cannot be refreshed for a while after the time t1. In some cases, there is a possibility that data stored in the memory cell 110a be lost.

To prevent such a data loss, according to the self-refresh method disclosed in International Patent Application Publication No. WO 02/082454, the timer period is held T1 during a predetermined period (time t1 to time t2) after the operational state is changed to a standby mode. During the predetermined period, all the plural word lines WL0 to WLn are driven. That is, a period from time t1 to time t2 is equal to the timer period T1. As mentioned above, even after the operational state is changed from the active one to the standby one, a refreshing operation for the word lines is executed under the same conditions as those of the active mode until all the word lines are refreshed. As a result, it is possible to prevent a loss of data stored in a memory cell upon the shift from the active mode to the standby mode. To summary, a reliability of the semiconductor storage device improves. From time t2 onward, the timer period is set to T2 that is longer than T1. Hence, it is possible to avoid excessive self-refreshing operations in the standby mode, and save power consumption.

Figure 3:
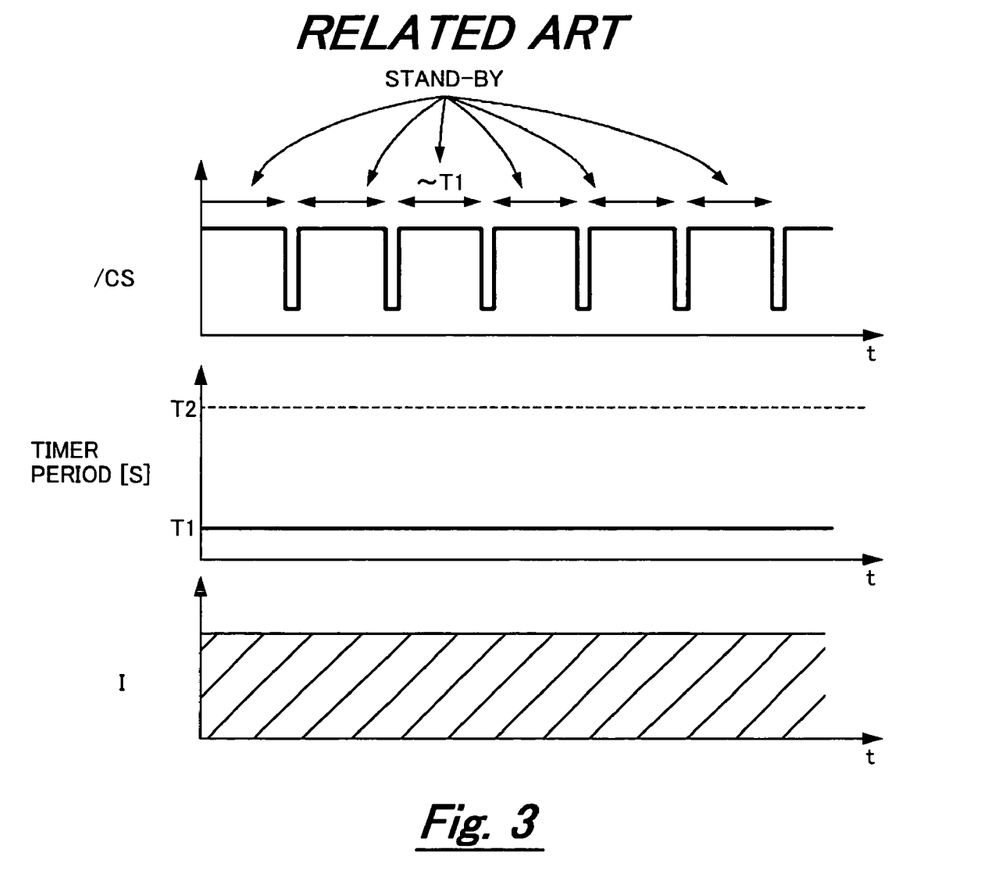
FIG. 3 is another timing chart showing a self-refresh operation of the conventional semiconductor storage device.

The technique disclosed in International Patent Application Publication No. WO 02/082454 involves the worst case as shown in FIG. 3. FIG. 3 shows the chip select signal "/CS", the timer period, and consumption current by the refresh operation. In FIG. 3, the chip select signal "/CS" is intermittently shifted to the Low level at regular intervals of several tens of ms. Accordingly, the semiconductor storage device is intermittently put in an active mode at regular intervals of several tens of ms. Such a standby mode period (several tens of ms) is equivalent to the above "Disturb Hold" and to the timer period T1. Thus, according to the technique disclosed in International Patent Application Publication No. WO 02/082454, after the operational state is changed to a standby mode, this operational state returns to the active mode before the timer period is set to T2. As a result, as shown in FIG. 3, the timer period is held T1 irrespective of the standby mode. Accordingly, the consumption current is the same as that of the active mode.

In this worst case, a period corresponding to the active mode is several ms at the longest. That is, a period where the semiconductor storage device is in an active mode is about 1/10 of a period where the device is in a standby mode. Hence, the power consumption is supposed to reduce. However, as mentioned above, the operational state that is changed to the standby mode returns to the active mode before the timer period is set to T2. Therefore, in the worst case of FIG. 3, an expected effect cannot be obtained. There is an increasing demand to save power consumption during a standby mode especially for a memory used in a cell phone, so its specifications are strictly limited. Therefore, a technique capable of saving power consumption even in the worst case of FIG. 3 is required.

SUMMARY OF THE INVENTION

A semiconductor storage device according to a first aspect of the present invention includes: a plurality of word lines; a plurality of memory cells provided corresponding to each of the plurality of word lines; and a refresh circuit for sequentially driving the plurality of word lines to refresh the plurality of memory cells based on a timer period, which sets the timer period depending on a disturb amount for the memory cells during an active mode upon shift from the active mode to a standby mode.

Hence, it is possible to prevent a loss of data stored in the memory cell just after the completion of the active mode. That is, a reliability of the semiconductor storage device improves. Further, a timer period upon the shift is set relatively long for a memory cell with a relatively small disturb amount in the active mode. Accordingly, it is possible to prevent an excessive refresh-operation at the start of the standby mode and save power consumption. Consequently, the quality of the semiconductor storage device can be improved.

According to a second aspect of the present invention, an operating method for a semiconductor storage device including a plurality of memory cells provided corresponding to a plurality of word lines, and sequentially driving the plurality of word lines to refresh each of the plurality of memory cells based on a timer period, includes: (A) refreshing each of the memory cells with a first period in an active mode; (B) changing the timer period in accordance with a disturb amount for the memory cells during the active mode upon shift from the active mode to a standby mode; and (C) refreshing each of the memory cells with a second period that is longer than the first period in the standby mode.

Hence, it is possible to prevent a loss of data stored in the memory cell just after the completion of the active mode. That is, a reliability of the semiconductor storage device improves. Further, a timer period upon the shift is set relatively long for a memory cell with a relatively small disturb amount in the active mode. Accordingly, it is possible to prevent an excessive refresh-operation at the start of the standby mode and save power consumption. Consequently, the quality of the semiconductor storage device can be improved.

A semiconductor storage device according to a third aspect of the present invention includes: a plurality of word lines; a plurality of memory cells provided corresponding to each of the plurality of word lines; and a refresh circuit for driving the plurality of word lines with a first refresh period in an active mode, driving the plurality of word lines with a second refresh period that is longer than the first refresh period in a standby mode, and driving the plurality of word lines with a third refresh period that is longer than the first refresh period and shorter than the second refresh period upon shift from the active mode to the standby mode. Hence, a quality of the semiconductor storage device can be improved.

According to the semiconductor storage device and the operating method therefor of the present invention, a reliability and quality of the semiconductor storage device improve.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The semiconductor storage device according to the present invention has a plurality of word lines a plurality of memory cells provided corresponding to each of the plurality of word lines; and a refresh circuit. The refresh circuit drives the plurality of word lines to refresh the plurality of memory cells sequentially based on a timer period. And The refresh circuit sets the timer period depending on a disturb amount for the memory cells during an active mode upon shift from the active mode to a standby mode. Referring to the accompanying drawings, a semiconductor storage device, and an operating method for the semiconductor storage device are described.

Figure 4:
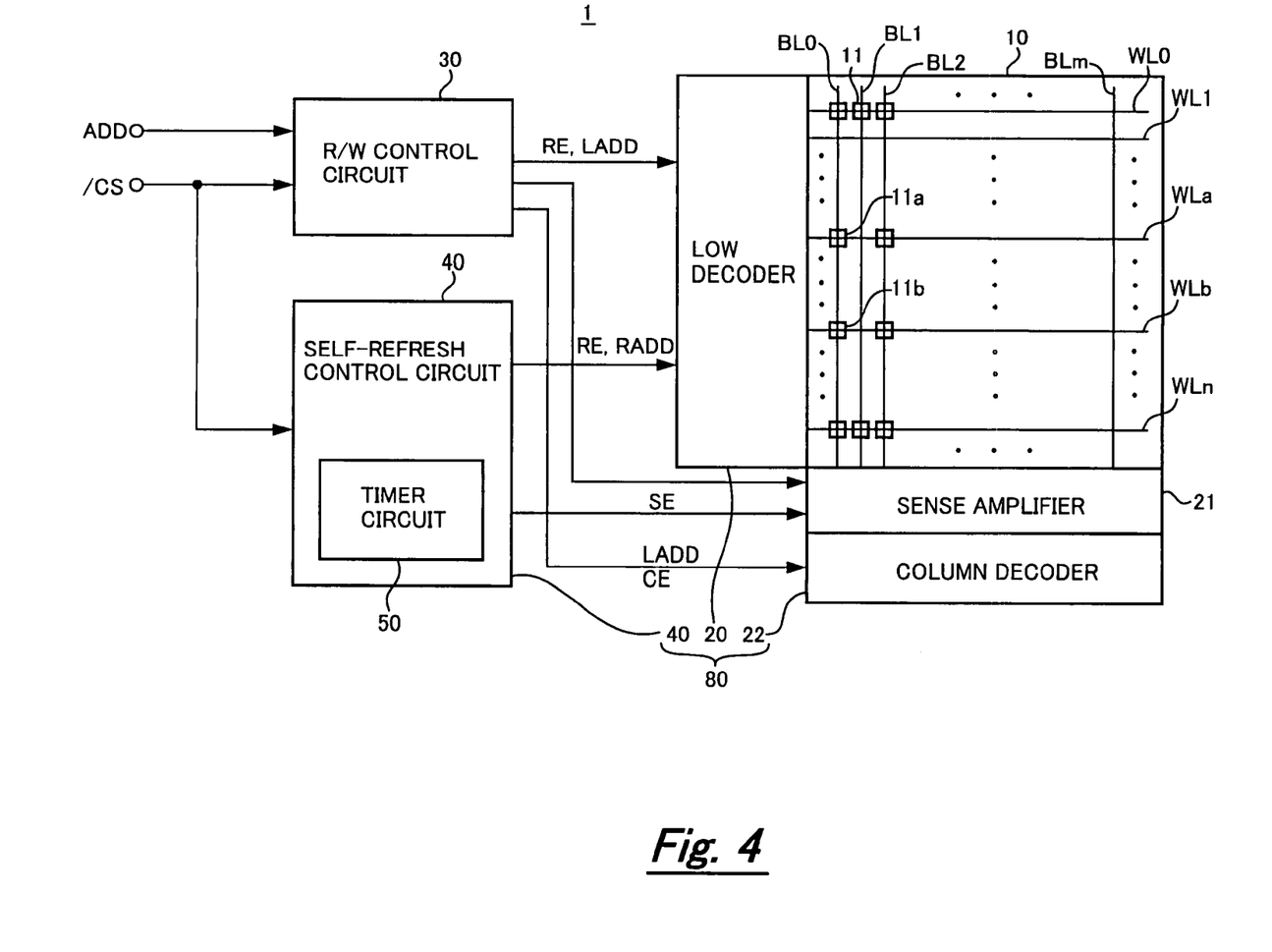
FIG. 4 is a block diagram showing the configuration of a semiconductor storage device according to the present invention.

FIG. 4 is a block diagram showing the configuration of the semiconductor storage device according to the present invention. A semiconductor storage device 1 includes a memory cell array 10, a row decoder 20, a sense amplifier 21, a column decoder 22, an R/W control circuit 30, and a self-refresh circuit 40. The memory cell array 10 includes plural arrayed memory cells 11. Each memory cell 11 has a capacitor. The capacitor accumulates charges to thereby store data. That is, the semiconductor storage device 1 is typified by a DRAM or a pseudo SRAM. Accordingly, the semiconductor storage device 1 according to this embodiment needs to be refreshed. In this embodiment, a self-refresh operation is executed.

In the memory cell array 10, plural word lines WL0 to WLn are arranged and plural bit lines BL0 to BLm cross the plural word lines WL0 to WLn. The plural memory cells 11 are arranged at intersections therebetween. A gate electrode of each memory cell 11 is connected to a corresponding one of the word lines. The plural word lines WL0 to WLn are connected to the row decoder 20. The plural bit lines BL0 to BLm are connected with the column decoder 22 through the sense amplifier 21.

The R/W control circuit 30 is a circuit for controlling an operation of reading/writing data from/to the memory cell array 10. The R/W control circuit 30 receives an address signal ADD and a chip select signal "/CS" from the outside of the semiconductor storage device 1. The address signal ADD indicates an address of the memory cell 11 as an access target. The chip select signal "/CS" is a signal for controlling an operational state (active/standby state) of the semiconductor storage device 1. When the chip select signal "/CS" is at a "Low" level, the semiconductor storage device 1 operates in an "active mode". When the chip select signal "/CS" is at a "High" level, the semiconductor storage device 1 operates in a "standby mode". Only in the active mode, data is read/written from/to the memory cell array 10.

When the chip select signal "/CS" is shifted to "Low", the R/W control circuit 30 is activated. The R/W control circuit 30 sends a row enable signal RE and an internal address signal LADD to row decoder 20, sends a sense amplifier enable signal SE to the sense amplifier 21, and sends a column enable signal CE and an internal address signal LADD to the column decoder 22. Hence, the row decoder 20, the sense amplifier 21, and the column decoder 22 are each activated. The row decoder 20 drives a word line WL corresponding to the internal address signal LADD. The column decoder 22 selects a bit line BL corresponding to an internal address signal LADD. The sense amplifier 21 applies a write voltage to the selected bit line BL, or amplifies a signal on the selected bit line BL to output the signal to the outside as read data. In this way, the data is written/read to/from the memory cell array 10.

The self-refresh control circuit 40 controls a self-refresh operation for the memory cell array 10, and is incorporated into the semiconductor storage device 1. The self-refresh control circuit 40 sends a row enable signal RE and a refresh address signal RADD to the row decoder 20, and sends a sense amplifier enable signal SE to the sense amplifier 21 at a predetermined timing. Thus, the row decoder 20 and the sense amplifier 21 are each activated. The row decoder 20 drives a word line WL corresponding to the refresh address signal RADD. The sense amplifier 21 reads data stored in each of the plural memory cells 11 connected with the driven word line WL through the plural bit lines BL0 to BLm. The read data is amplified with the sense amplifier 21 and rewritten to each of the plural selected memory cells 11. A refresh operation for one word line WL is executed this way.

The self-refresh operation is executed by sequentially scanning the word lines WL to be driven. That is, the self-refresh control circuit 40 executes control such that the plural word lines WL0 to WLn are driven sequentially and repeatedly. A period necessary for driving all the plural word lines WL0 to WLn is called a "timer period". For example, a memory cell 11a connected with a word line WLa is refreshed based on the timer period. Further, a memory cell 11b connected with a word line WLb is refreshed based on the timer period.

In the present invention, the foregoing self-refresh control circuit 40, row decoder 20, and sense amplifier 21 constitutes a "self-refresh circuit 80". That is, the self-refresh circuit 80 sequentially drives the plural word lines WL0 to WLn to refresh each memory cell 11 with a corresponding timer period. As described later, the timer period is variable. The timer period may be determined based on a predetermined clock signal. Thus, the self-refresh control circuit 40 disposed in the self-refresh circuit 80 includes a timer circuit 50 for outputting a variable clock signal. The self-refresh circuit 80 can determine the timer period based on a clock signal output from the timer circuit 50.

Figure 5:
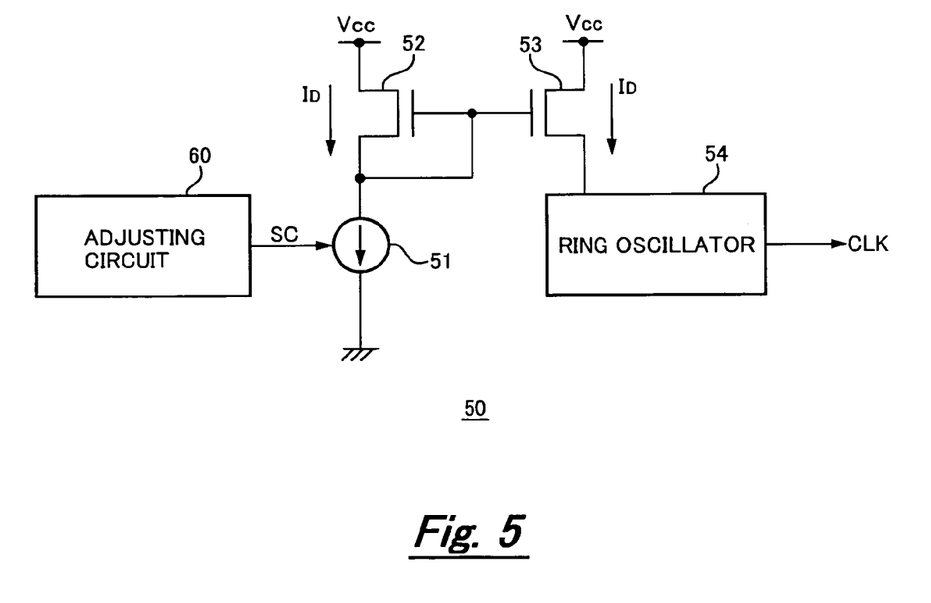
FIG. 5 is a block diagram showing the configuration of a timer circuit in the semiconductor storage device according to the present invention.

FIG. 5 is a block diagram showing the configuration of the timer circuit 50 according to the present invention. The timer circuit 50 includes a variable current source 51, PMOS transistors 52 and 53, a ring oscillator 54, and an adjusting circuit 60. The variable current source 51 changes an output current $I_D$ in response to a control signal SC. A source of the PMOS transistor 52 is connected with a power supply, and a drain thereof is connected with the variable current source 51. In addition, the PMOS transistor 52 is diode-connected, and its drain and gate are connected. A gate, source, and drain of the PMOS transistor 53 are respectively connected with a gate of the PMOS transistor 52, the power supply, and the ring oscillator 54. That is, the PMOS transistors 52 and 53 constitute a current-mirror circuit configuration. Due to the current-mirror circuit configuration, a current equivalent to the current $I_D$ from the variable current source 51 is supplied to the ring oscillator 54 as the driving current $I_D$. The ring oscillator 54 is composed of three inverters connected in a ring shape, and generates a clock signal CLK of a frequency corresponding to the driving current $I_D$.

The adjusting circuit 60 outputs the control signal SC for adjusting the output current $I_D$ to the variable current source 51. Here, the adjusting circuit 60 adjusts the control signal SC in accordance with an operational mode of the semiconductor storage device 1, that is, a level of the chip select signal "/CS". To be specific, the adjusting circuit 60 controls the variable current source 51 such that an amount of the current $I_D$ in the standby mode is smaller than that in the active mode. Thus, a frequency of a clock signal CLK generated by the ring oscillator 54 is lower in the standby mode than in the active mode. Accordingly, the timer period in the standby mode is longer than that in the active mode.

As described later in detail, the adjusting circuit 60 of the present invention controls the variable current source 51 based on a "disturb" amount relative to the memory cell array 10 or the memory cell 11 upon the shift from the active mode to the standby mode. The disturb amount relative to a given memory cell 11 is defined based on an elapsed time from the last time when the memory cell 11 is refreshed during the active mode period to the end of the active mode period, for example. Further, a disturb amount relative to the memory cell array 10 is defined based on the number of reading/writing operations for the memory cell array 10 during a predetermined period before the end of the active mode (the number of read/write commands), for example.

Hereinafter, a self-refresh operation of the semiconductor storage device 1 according to the present invention is described in detail.

First Embodiment

Figure 6:
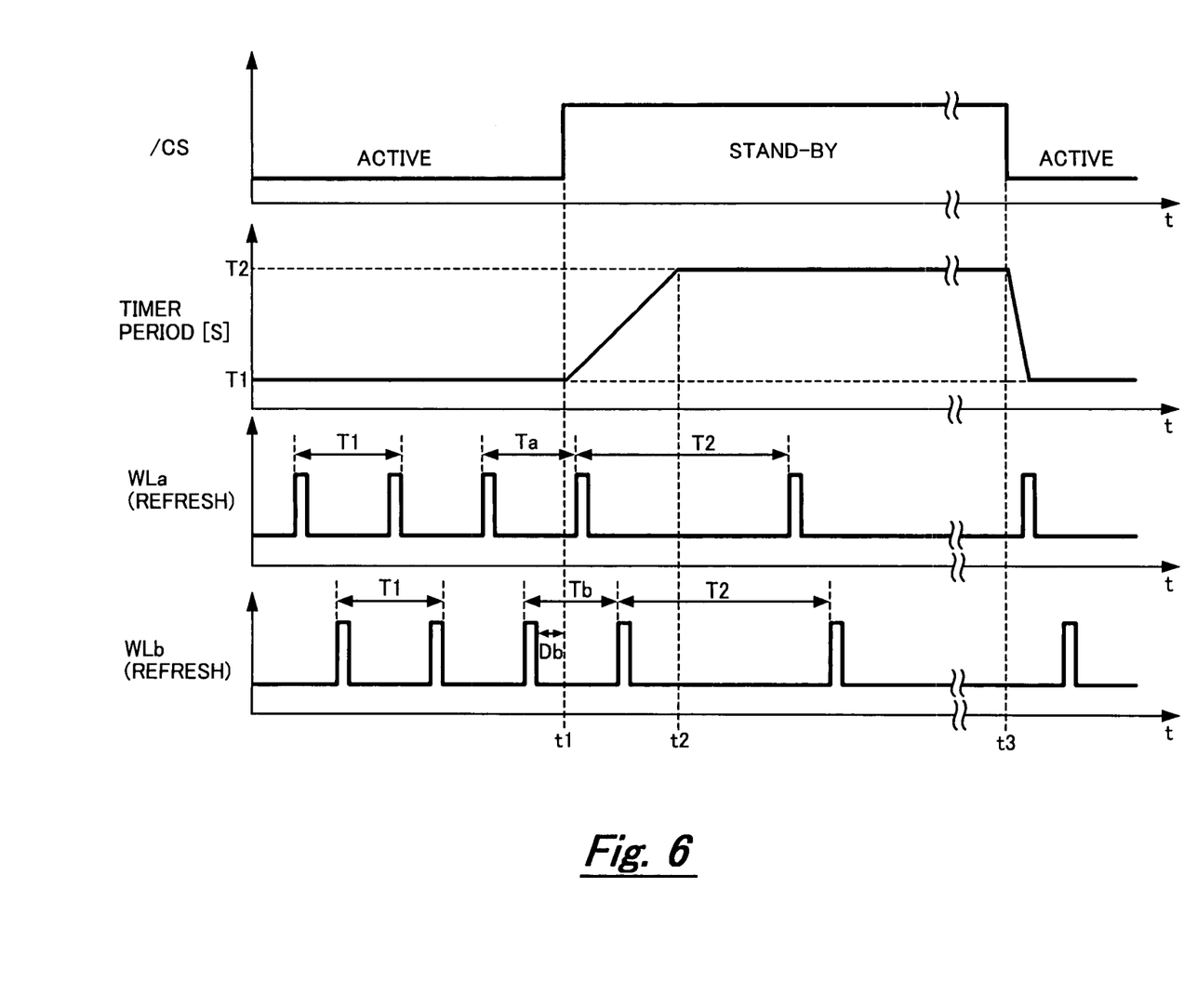
FIG. 6 is a timing chart showing a self-refresh operation of a semiconductor device according to a first embodiment of the present invention.

FIG. 6 is a timing chart of a self-refresh operation according to a first embodiment of the present invention. FIG. 6 shows a chip select signal "/CS", a timer period, a refresh pulse for the word line WLa (see FIG. 4), and a refresh pulse for the word line WLb. In the illustrated example of FIG. 6, at a time t1, the chip select signal "/CS" is changed from Low to High, and an operational state is shifted from the active one to the standby one. A refresh operation is executed on a given word line WL during a timer period T1 in the active mode and during a timer period T2 in the standby mode. The timer period T1 is determined based on a hold characteristic (Disturb Hold) of the memory cell 11 in the active mode. On the other hand, the timer period T2 is determined based on a hold characteristic (static Hold) of the memory cell 11 in the standby mode and is set longer than the timer period T1.

As shown in FIG. 6, a period (elapsed time) from the last refreshing time for the word line WLa in the active mode to the time t1 when the chip select signal "/CS" is shifted to "High" is represented as Da. Further, a period from the last refreshing time for the word line WLb in the active mode to the time t1 when the chip select signal "/CS" is shifted to "High" is represented as Db. In this example, the period Da is set longer than the period Db. During the periods Da and Db, the memory cell 11a or 11b is disturbed due to a write voltage applied to a corresponding bit line BL. That is, an elapsed time (Da, Db) from the last refreshing operation in the active mode to the time t1 as the end time of the active mode corresponds to a disturb amount for each memory cell 11. The disturb amount is determined based on the elapsed time (Da, Db). The elapsed time Da is longer than the elapsed time Db, so at the time t1, a disturb amount for the memory cell 11a is more likely to be larger than that for the memory cell 11b. As mentioned above, the disturb amount varies at the end time of the active mode depending on the order in which the refresh operation is executed.

According to this embodiment, upon the shift of the operational state from the active mode to the standby mode, the time period is variably set depending on the elapsed time (disturb amount) for each memory cell 11. More specifically, the timer period is set such that the memory cell 11 the elapsed time of which is longer is preferentially refreshed. This makes it possible to avoid a loss of data stored in the memory cell 11 upon the shift from the active mode to the standby mode. On the other hand, the time period is set such that the memory cell 11 the elapsed time of which is shorter is refreshed non-preferentially. Thus, it is possible to prevent a refresh operation from being excessively executed at the start of the standby mode.

To elaborate, as shown in FIG. 6, the timer period is monotonously increased from a first period T1 to a second period T2 over a period from the time t1 to the time t2. The first period T1 is a timer period in the active mode, and the second period T2 is a timer period in the standby mode. That is, the timer period is basically switched in two stages; it is desirable that the period be switched gently. In other words, the period is switched from the first period T1 to the second period T2 little by little over a predetermined period (time t1 to time t2), not stepwise. The predetermined period (time t1 to time t2) only needs to be enough to drive all the plural word lines WL0 to WLn. As mentioned above, upon the shift to the standby mode, the timer period is monotonously increased from the first period T1 to the second period gradually. Hence, an adequate timer period can be set for each of the plural word lines WL0 to WLn. That is, the timer period is monotonously increased from the first period T1 to the second period T2 upon the shift from the active mode to the standby mode in order to set an adequate timer period for each word line. The timer period can be thereby changed from one memory cell to another.

Upon the shift from the first period T1 to the second period T2, the timer period is monotonously increased, so the longer elapsed time means the shorter timer period upon the shift, and the shorter elapsed time means the longer timer period upon the shift. That is, upon the shift from the active mode to the standby mode, the memory cell 11a with a relatively large disturb amount is refreshed during a relatively short timer period Ta, and the memory cell 11b with a relatively small disturb amount is refreshed during a relatively long timer period Tb. As a result, it is possible to prevent a loss of data stored in the memory cell 11 during the shift. Further, it is possible to prevent an excessive refresh operation during the shift. Accordingly, a reliability of the semiconductor storage device 1 is improved and power consumption is reduced. That is, a quality of the semiconductor storage device 1 is enhanced. At a time t3, the chip select signal "/CS" is changed from "High" to "Low", and an operational state is shifted from a standby mode to an active mode. When the operational state is changed to the active mode, there is a possibility that the memory cell 11 is disturbed at once. Thus, at the completion of the standby mode, the timer period is swiftly switched from the second period T2 to the first period T1. The time taken for the timer period to reduce from the second period T2 to the first period T1 is shorter than the time taken for the timer period to increase from the first period T1 to the second period T2.

Figure 7:
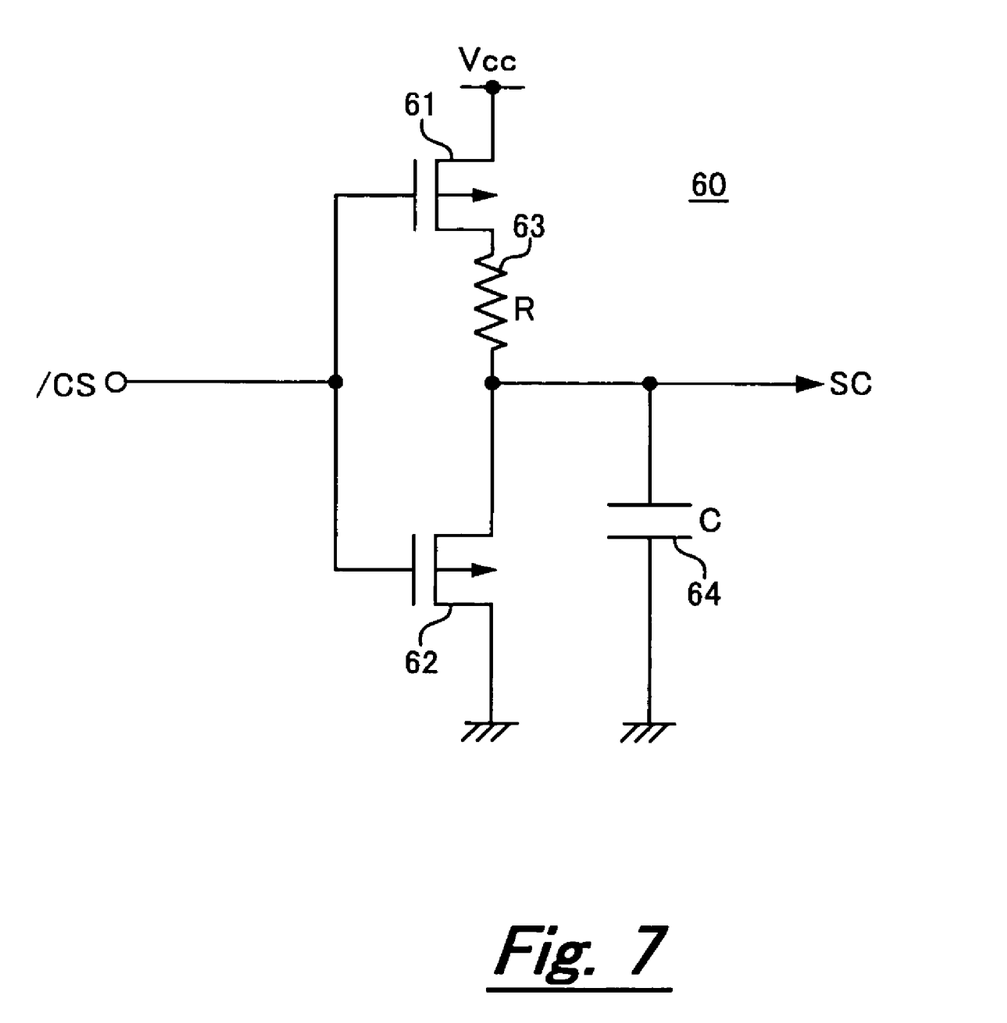
FIG. 7 is a circuit diagram showing the configuration of an adjusting circuit according to the first embodiment of the present invention.

FIG. 7 shows a configuration example of the adjusting circuit 60 for executing the operation of FIG. 6. The adjusting circuit 60 according to this embodiment includes a PMOS transistor 61, an NMOS transistor 62, a resistor 63, and a capacitor 64. The adjusting circuit 60 is configured such that an inverter incorporates the resistor 63 and the capacitor 64. To be specific, a source of the PMOS transistor 61 is connected with a power supply, and a drain thereof is connected with a node through the resistor 63. A source of the NMOS transistor 62 is grounded, and a drain thereof is connected with the node. The node is connected with an output terminal. The capacitor 64 is placed between the output terminal and the ground terminal. The adjusting circuit 60 receives the chip select signal "/CS". The chip select signal "/CS" is supplied to gates of the PMOS transistor 61 and the NMOS transistor 62.

The chip select signal "/CS" to be supplied to the adjusting circuit 60 is changed more slowly in accordance with an RC constant determined with the resistor 63 and the capacitor 64. The chip select signal "/CS" specifying the active mode or the standby mode is input to the adjusting circuit 60. The adjusting circuit 60 changes the chip select signal "/CS" based on a time constant determined based on the resistor and the capacitor. The chip select signal "/CS" changed based on a time constant is output as the control signal SC. That is, the adjusting circuit 60 outputs the generated signal as a control signal SC to the variable current source 51. Hence, upon the shift from the active mode to the standby mode, the variable current source 51 slowly decreases the current $I_D$. Thus, a frequency of a clock signal CLK generated by the ring oscillator 54 is gently lowered. A timer period determined based on the clock signal CLK is gently increased. As mentioned above, the self-refresh circuit 80 according to this embodiment monotonously increases the timer period from the first period T1 to the second period T2 over a predetermined period according to the RC time constant.

Figure 8:
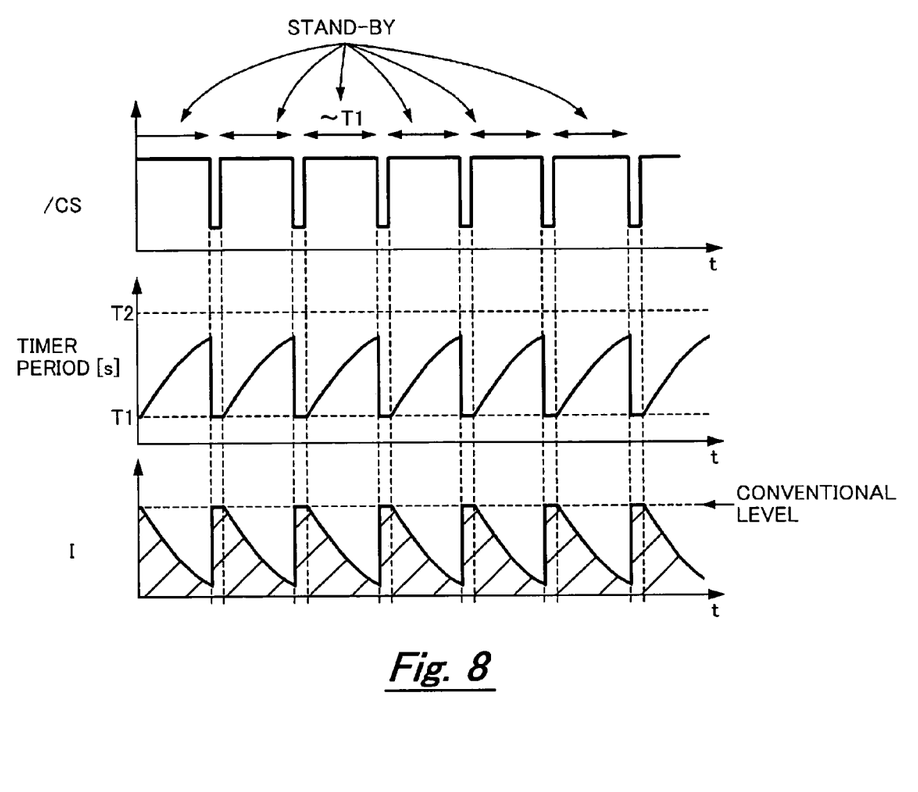
FIG. 8 illustrates a beneficial effect of the first embodiment of the present invention.

FIG. 8 illustrates beneficial effects of this embodiment in contrast to the worst case of FIG. 3. FIG. 8 shows the chip select signal "/CS", the timer period, and the current I consumed by the refresh operation. The chip select signal "/CS" is intermittently shifted to the Low level at regular intervals of several tens of ms (to T1). A period corresponding to the active mode is several ms at the longest. That is, a period where the semiconductor storage device is in the active mode is about 1/10 of a period where the device is in the standby mode. Hence, the consumption current is supposed to reduce.

As shown in FIG. 8, according to this embodiment, the timer period is gently increased just after the completion of the active mode. As compared with the case of FIG. 3, such a period that the timer period is held T1 irrespective of the standby mode is eliminated. As a result, the excessive self-refresh operation in the standby mode is avoided. Thus, even in the conventional worst case, an expected effect of saving power consumption can be attained.

In addition, according to this embodiment, the timer period is not changed to the second period T2 suddenly just after the completion of the active mode. The timer period at the start of the standby mode is determined based on the disturb amount in the active mode. Therefore, data stored in the memory cell 11 is prevented from being lost at the start of the standby mode. That is, a reliability of the semiconductor storage device 1 improves.

As mentioned above, according to the semiconductor storage device 1 of the present invention, a quality is improved. The semiconductor storage device 1 according to the present invention is preferably applied especially to a cell phone highly required to reduce power consumption in a standby mode.

Second Embodiment

Figure 9:
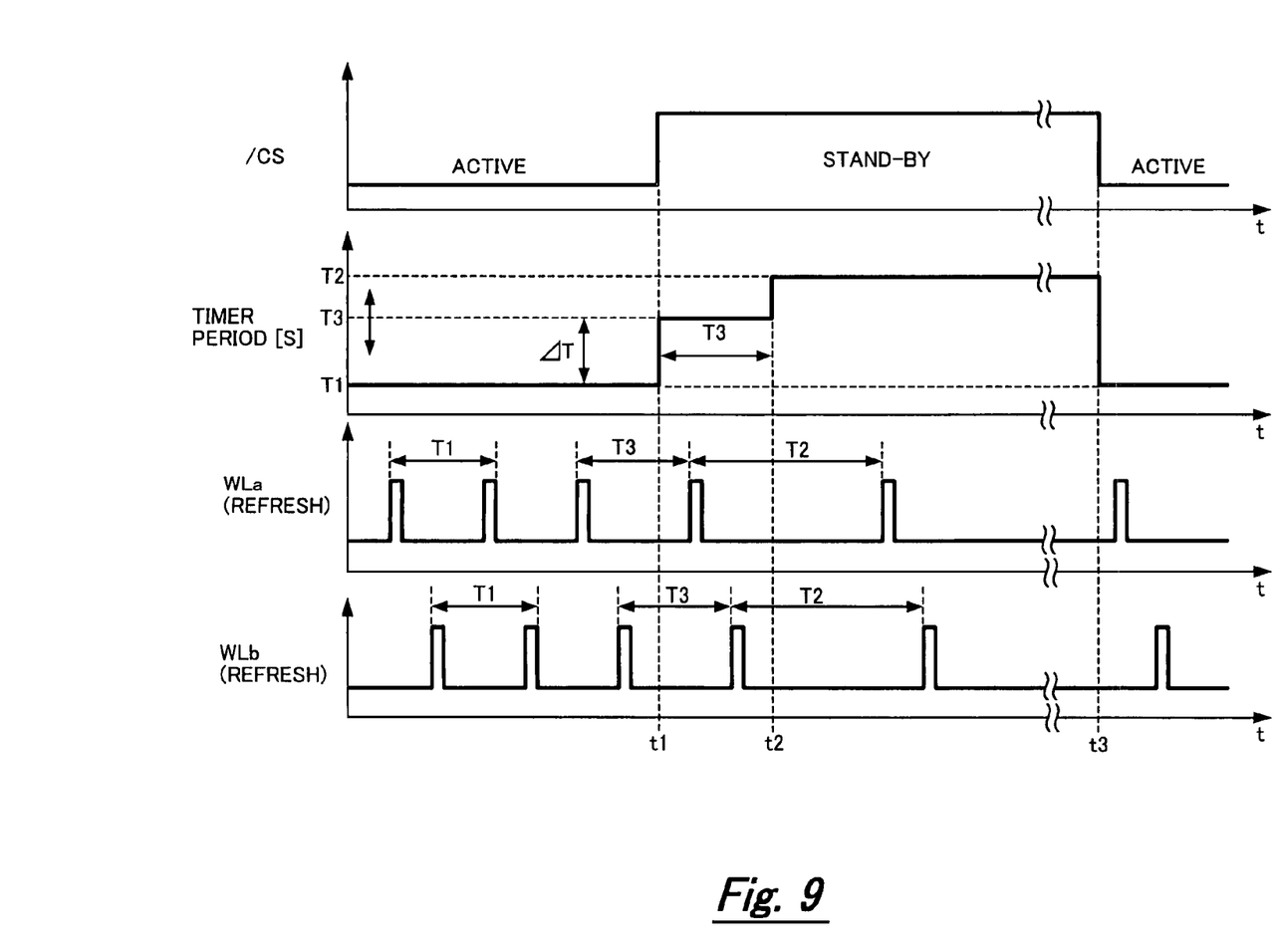
FIG. 9 is a timing chart showing a self-refresh operation of a semiconductor device according to a second embodiment of the present invention.

FIG. 9 is a timing chart of a self-refresh operation according to a second embodiment of the present invention. FIG. 9 shows the chip select signal "/CS", the timer period, a refresh pulse for the word line WLa, and a refresh pulse for the word line WLb. At the time t1, the chip select signal "/CS" is changed from Low to High, and an operational state is shifted from the active mode to the standby mode.

According to this embodiment, the self-refresh circuit 80 sets the timer period in three steps: first period T1, second period T2, and third period T3. More specifically, the self-refresh circuit 80 sets the timer period to the first period T1 in the active mode, and sets the timer period to the second period T2 in the standby mode. However, during a predetermined period just after the completion of the active mode (time t1 to time t2), the self-refresh circuit 80 sets the timer period to the third period T3. The second period T2 is longer than the first period T1. The third period T3 is variably set within a range from the first period T1 to the second period T2. That is, at the time t1, the timer period is increased from T1 to T3. A period where the timer period is set to T3 is a period necessary for driving all the plural word lines WL0 to WLn. That is, a period from the time t1 to the time t2 corresponds to the timer period T3, and during this period, the timer period is kept at T3. At the time t2, the timer period is increased from T3 to T2. At the time t3, the timer period is decreased from T2 to T1.

A difference ΔT between the third period T3 and the first period T1 is set variable depending on the disturb amount during a predetermined period before the completion of the active mode. The disturb amount is defined based on the number of reading/writing operations (read/write commands) during the predetermined period before the completion of the active mode. According to this embodiment, the self-refresh circuit 80 sets the third period T3 (difference ΔT) longer when the number of reading/writing operations during the predetermined period is smaller. That is, the self-refresh circuit 80 sets the third period T3 more approximate to the second period T2. Conversely, the self-refresh circuit 80 sets the third period T3 (difference ΔT) shorter when the number of reading/writing operations during the predetermined period is larger. That is, the self-refresh circuit 80 sets the third period more approximate to the first period T1.

As mentioned above, according to this embodiment, the self-refresh circuit 80 sets the timer period T3 based on the disturb amount during the predetermined period before the completion of the active mode. More specifically, if the disturb amount during the predetermined period before the completion of the active mode is large, the timer period T3 at the start of the standby mode is set shorter. Hence, it is possible to prevent a loss of data stored in the memory cell 11 at the start of the standby mode (upon the shift). On the other hand, if the disturb amount during the predetermined period before the completion of the active mode is small, the timer period T3 at the start of the standby mode is set longer. Hence, it is possible to prevent an excessive refresh operation at the start of the standby mode.

Figure 10:
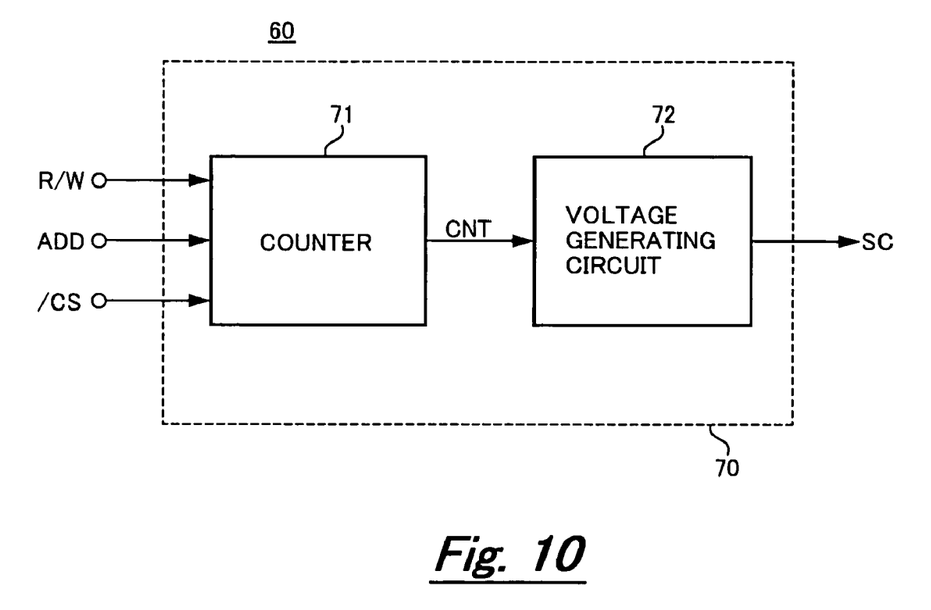
FIG. 10 is a circuit diagram showing the configuration of an adjusting circuit according to the second embodiment of the present invention.

FIG. 10 shows a configuration example of the adjusting circuit 60 for executing the operation of FIG. 9. The adjusting circuit 60 according to this embodiment includes a disturb detecting device 70 for detecting a disturb amount during the predetermined period before the completion of the active mode. The disturb detecting device 70 includes a counter 71 and a voltage generating circuit 72. The counter 71 receives the chip select signal "/CS" and the read/write command R/W. The counter 71 counts the number of read/write commands R/W during a predetermined period (determination period PJ) before the time when the chip select signal "/CS" is shifted from "Low" to "High". When the chip select signal "/CS" is shifted from "Low" to "High", the counter 71 sends a count signal CNT representing the count value at this point, to the voltage generating circuit 72. The voltage generating circuit 72 outputs the control signal SC having the signal voltage corresponding to the count value to the variable current source 51.

It is impossible to predict a timing at which the chip select signal "/CS" is changed. Thus, the counter 71 of this embodiment determines the disturb amount during the determination period PJ based on a method of FIG. 11, for example. The operation of reading/writing data from/to the memory cell array 10 is executed with a predetermined R/W cycle (operational cycle). One operational cycle is, for example, 100 nsec. For example, if the timer period T1 is 30 ms, one timer period in the active mode includes 300 operational cycles. A period corresponding to a predetermined number of operational cycles out of the one timer period is set as the determination period PJ.

Figure 11:
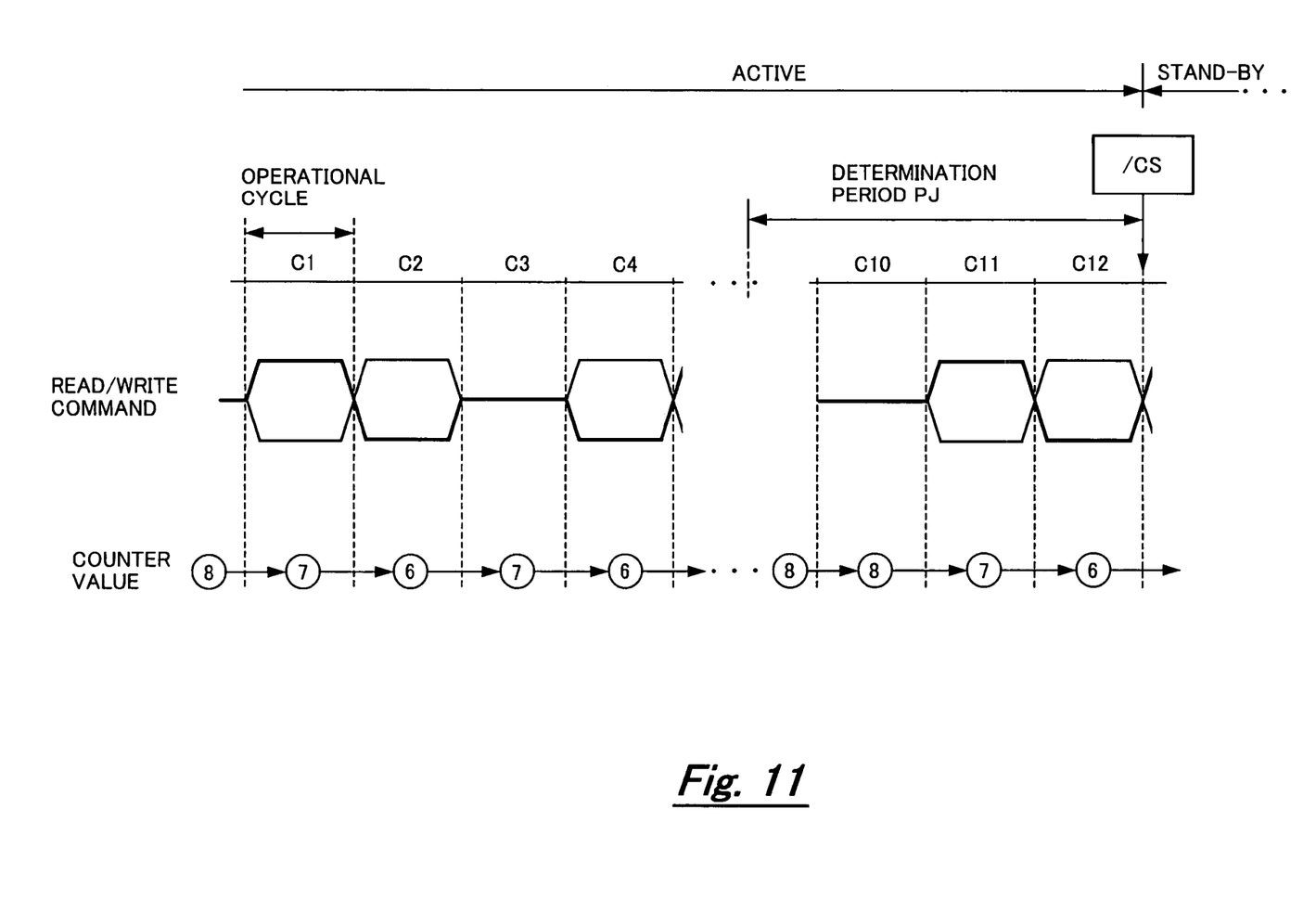
FIG. 11 is a conceptual view showing an operation of a counter according to the second embodiment of the present invention.

Consider a case where a period corresponding to eight operational cycles is determined as the determination period PJ. In this case, the counter 71 sets an initial value and the maximum count value to "8". Then, the counter 71 determines whether or not the read/write command R/W is input every operational cycle. If the read/write command R/W is input (Disturb), the counter 71 decrements the count value by 1. If the read/write command R/W is not input (Static), the counter 71 increments the count value by 1. The upper limit of the count value is "8". For example, at an operational cycle C10, although the read/write command R/W is not input, the count value is kept "8".

In this way, the counter 71 continuously monitors the latest history of the read/write commands R/W during the 8 operational cycles. Then, at a point when the chip select signal "/CS" is input, the counter 71 outputs information about the current count value. In the illustrated example of FIG. 11, after an operational cycle C12, the chip select signal "/CS" is changed to "High", and information about the count value of "6" is output. Incidentally, in the illustrated example of FIG. 11, the larger count value means the smaller disturb amount during the determination period PJ, and the smaller count value means the larger disturb amount during the determination period PJ. Further, when the operational state is changed from the standby mode to the active mode, the count value is reset. That is, the counter is initialized.

As mentioned above, according to this embodiment, whichever timing the chip select signal "/CS" is changed at, the number of reading/writing operations during the predetermined period (determination period PJ) just before the timing is detected. The self-refresh circuit 80 variably sets the third period based on the number of reading/writing operations. That is, a period corresponding to the number of read/write commands R/W during the predetermined period before the shift from the active mode is set as the third period T3. Accordingly, in general, each time the operational state is switched from the active mode, the third period T3 is newly set. In this way, a self-refresh operation of FIG. 9 is executed. Incidentally, the disturb detecting device 70 may be provided for each area in the memory cell array 10. In this case, the counter 71 references the address signal ADD to count the number of read/write commands R/W for each area. That is, the third period T3 that varies from one word line to another is set as the timer period depending on the disturb amount. Hence, more precise control can be executed. Above mentioned, the self-refresh circuit 80 sets a different between the third period and the first period larger if the number of reading/writing operations is smaller.

Figure 12:
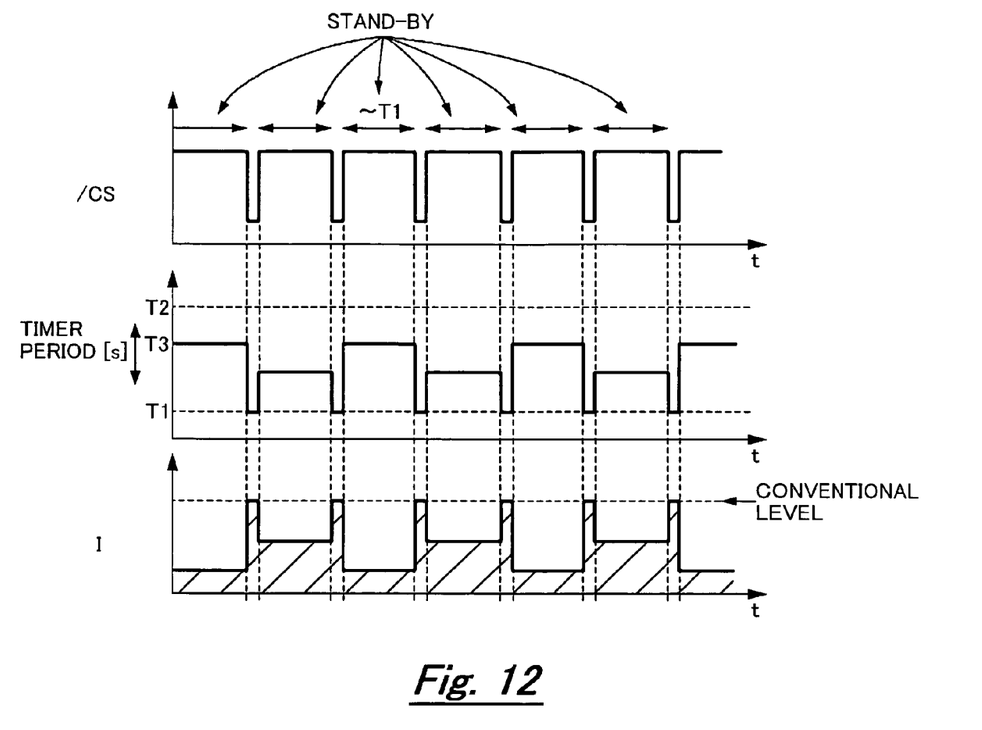
FIG. 12 illustrates a beneficial effect of the first embodiment of the present invention.

FIG. 12 illustrates beneficial effects of this embodiment in contrast to the worst case of FIG. 3. FIG. 12 shows the chip select signal "/CS", the timer period, and power consumed by the refresh operation. The chip select signal "/CS" is intermittently activated at regular intervals of several tens of ms (less than T1). A period corresponding to the active mode is several ms at the longest. That is, a period where the semiconductor storage device is in an active mode is about 1/10 of a period where the device is in a standby mode. Hence, the consumption current is supposed to reduce.

As shown in FIG. 12, according to this embodiment, upon the completion of the active mode, the timer period is set to the third period T3. As compared with the case of FIG. 3, such a period that the timer period is held T1 irrespective of the standby mode is eliminated. As a result, the excessive self-refresh operation in the standby mode is avoided. Thus, even in the conventional worst case, an expected effect of saving power consumption can be attained.

In addition, according to this embodiment, the timer period is not changed to the second period T2 suddenly just after the completion of the active mode. The timer period at the start of the standby mode is determined based on the disturb amount in the active mode. Therefore, data stored in the memory cell 11 is prevented from being lost at the start of the standby mode. That is, a reliability of the semiconductor storage device 1 improves.

As set forth above, according to the semiconductor storage device 1 of the present invention, a quality improves.

The semiconductor storage device 1 according to the present invention is preferably applied especially to a cell phone highly required to reduce power consumption in a standby mode.

It is apparent that the present invention is not limited to the above embodiment that may be modified and changed without departing from the scope and spirit of the invention.

What is claimed is:

1. A semiconductor storage device, comprising:
   a plurality of word lines;
   a plurality of memory cells provided corresponding to each of the plurality of word lines; and
   a refresh circuit for sequentially driving the plurality of word lines to refresh the plurality of memory cells based on a timer period, which sets the timer period depending on a disturb amount for the memory cells during an active mode upon shift from the active mode to a standby mode, the disturb amount is corresponding to the elapsed time last refresh operation.

2. The semiconductor storage device according to claim 1, wherein the disturb amount for each of the memory cells is determined based on an elapsed time from the last refresh operation during the active mode to the completion of the active mode, and
   the refresh circuit sets the timer period for each of the word lines.

3. The semiconductor storage device according to claim 2, wherein the refresh circuit sets the timer period for each of the memory cells such that the timer period becomes shorter for the longer elapsed time, after the completion of the active mode.

4. The semiconductor storage device according to claim 2, wherein the refresh circuit sets the timer period to a first period in the active mode, and monotonously increases the timer period from the first period to a second period that is longer than the first period after the completion of the active mode.

5. The semiconductor storage device according to claim 4, wherein the refresh circuit monotonously increases the timer period from the first period to the second period until all the plurality of word lines are driven after the completion of the active mode.

6. The semiconductor storage device according to claim 4, wherein the refresh circuit decreases the timer period from the second period to the first period after the completion of the standby mode, and
   a time taken for the timer period to reduce from the first period to the second period is longer than the time taken for the timer period to increase from the second period to the first period.

7. The semiconductor storage device according to claim 4, wherein the refresh circuit determines the timer period based on a clock signal output from a timer circuit,
   the timer circuit includes:
   an oscillator for generating the clock signal of a frequency corresponding to a driving current;
   a current source for supplying the driving current to the oscillator; and
   an adjusting circuit including a resistor and a capacitor and outputting a control signal to the current source to adjust the driving current, and
   a chip select signal specifying the active mode or the standby mode is input to the adjusting circuit, and the chip select signal that is changed based on a time constant determined based on the resistor and the capacitor is output as the control signal.

8. The semiconductor storage device according to claim 1, wherein the disturb amount is determined based on the number of operations of reading/writing data from/to the plurality of memory cells during a predetermined period before the completion of the active mode.

9. The semiconductor storage device according to claim 8, wherein the refresh circuit sets the timer period longer if the number of operations is smaller, after the completion of the active mode.

10. The semiconductor storage device according to claim 8, wherein the refresh circuit sets the timer period to the first period in the active mode, and sets the timer period to a third period that is longer than the first period upon the shift from the active mode to the standby mode and then setting the timer period to a second period that is longer than the third period.

11. The semiconductor storage device according to claim 10, wherein the refresh circuit keeps the timer period at the third period until all the plurality of word lines are driven after the completion of the active mode.

12. The semiconductor storage device according to claim 10, wherein the refresh circuit sets a different between the third period and the first period larger if the number of operations is smaller.

13. An operating method for a semiconductor storage device including a plurality of memory cells provided corresponding to a plurality of word lines, and sequentially driving the plurality of word lines to refresh each of the plurality of memory cells based on a timer period, comprising:
   (A) refreshing each of the memory cells with a first period in an active mode;
   (B) changing the timer period in accordance with a disturb amount for the memory cells during the active mode upon shift from the active mode to a standby mode; and
   (C) refreshing each of the memory cells with a second period that is longer than the first period in the standby mode.

14. The operating method for a semiconductor storage device according to claim 13, wherein the disturb amount for each of the memory cells is determined based on an elapsed time from the last refresh operation during the active mode to the completion of the active mode, and
   the timer period is set for each of the word lines.

15. The operating method for a semiconductor storage device according to claim 14, wherein (B) the changing includes setting the timer period for each of the memory cells such that the timer period becomes shorter for the longer elapsed time.

16. The operating method for a semiconductor storage device according to claim 14, wherein (B) the changing includes monotonously increasing the timer period from the first period to the second period.

17. The operating method for a semiconductor storage device according to claim 16, wherein (B) the changing includes monotonously increasing the timer period from the first period to the second period until all the plurality of word lines are driven after the completion of the active mode.

18. The operating method for a semiconductor storage device according to claim 13, wherein the disturb amount is determined based on the number of operations of reading/writing data from/to the plurality of memory cells during a predetermined period before the completion of the active mode.

19. The operating method for a semiconductor storage device according to claim 18, wherein (B) the changing includes setting the timer period longer if the number of operations is smaller.

20. A semiconductor storage device, comprising:
   a plurality of word lines;
   a plurality of memory cells provided corresponding to each of the plurality of word lines; and
   a refresh circuit for driving the plurality of word lines with a first refresh period in an active mode, driving the plurality of word lines with a second refresh period that is longer than the first refresh period in a standby mode, and driving the plurality of word lines with a third refresh period that is longer than the first refresh period and shorter than the second refresh period upon shift from the active mode to the standby mode.

* * * * *